United States Patent [19]

Adams et al.

[11] Patent Number: 4,752,590

[45] Date of Patent: Jun. 21, 1988

[54] METHOD OF PRODUCING SOI DEVICES

[75] Inventors: Arthur C. Adams, Berkeley Heights; Loren N. Pfeiffer, Harding Township, Morris County; Kenneth W. West, Mendham, all of N.J.

[73] Assignee: Bell Telephone Laboratories, Incorporated, Murray Hill, N.J.

[21] Appl. No.: 898,326

[22] Filed: Aug. 20, 1986

[51] Int. Cl.[4] .................... H01L 21/265; C30B 13/06
[52] U.S. Cl. ..................................... 437/84; 156/603; 437/21; 437/29; 437/942
[58] Field of Search ...................... 148/1.5, 175, 187; 29/576 B, 576 T; 156/603

[56] References Cited

U.S. PATENT DOCUMENTS

| | | | |
|---|---|---|---|
| 4,323,417 | 4/1982 | Lam | 156/613 |
| 4,371,421 | 2/1983 | Fan et al. | 156/624 |
| 4,448,632 | 5/1984 | Akasaka | 156/603 |
| 4,453,306 | 6/1984 | Lynch et al. | 29/571 |
| 4,479,846 | 10/1984 | Smith et al. | 156/603 |
| 4,543,133 | 9/1985 | Mukai | 148/1.5 |
| 4,545,823 | 10/1985 | Drowley | 148/1.5 |
| 4,596,604 | 6/1986 | Akiyama et al. | 148/1.5 |
| 4,619,034 | 10/1986 | Janning | 29/571 |

OTHER PUBLICATIONS

*Applied Physics Letters*, vol. 48, No. 19, 12 May 1986, "New Capping Technique for Zone–Melting Recrystallization of Silicon–on–Insulator Films: by C. K. Chen et al., pp. 1300–1302.
*Laser–Solid Interactions and Transient Thermal Processing of Materials*, Materials Research Society Symposia Proceedings, vol. 13, 1982, editors J. Narayan, W. L. Brown, R. A. Lemons, pp. 575–580.
*Journal Electrochemical Society: Solid–State Science and Technology*, Dec. 1982, "Zone-Melting Recrystallization of Si Films with a Moveable–strip–Heater Oven" by M. W. Geis et al., pp. 2812–2818.
*VLSI Electronics Microstructure Science*, vol. 4, 1982, pp. 1–53, by N. G. Einspruch.

*Primary Examiner*—Upendra Roy
*Attorney, Agent, or Firm*—S. E. Hollander

[57] ABSTRACT

Disclosed are methods that result in substantial improvement of silicon-on-insulator (SOI) device manufacture. We have discovered that carbon can be advantageously used as a wetting agent in the melting-recrystallization (MR) method of producing SOI wafers. We have also found that contacting the wafer (typically subsequent to the formation thereon of a poly-Si layer on a $SiO_2$ layer but prior to the completion of formation of a $SiO_2$ cap layer on the poly-Si layer) with an atmosphere that comprises a wetting agent-containing molecular species (e.g., $CH_4$, $NH_3$), with the wafer at an appropriate elevated (e.g., 500°–900° C.) temperature, can reliably result in recrystallized Si films of high quality. Furthermore, we have discovered the existence of a previously unknown parameter regime (low thermal gradient across the resolidification front, typically no more than about 4° C./mm) for the MR process that can result in a highly perfect ($\chi$min of 3%, subboundary spacing of about 50 $\mu$m, misalignment across subboundaries of the order of 0.1°) resolidified Si layer. Devices can be fabricated directly in this layer, or the layer can be used as seed substrate for the growth of a "thick" epitaxial Si layer of the type useful for the fabrication of high voltage semiconductor devices.

10 Claims, 1 Drawing Sheet

METHOD OF PRODUCING SOI DEVICES

FIELD OF THE INVENTION

This invention pertains to processes for converting a layer of amorphous or polycrystalline silicon on insulator into single crystal Si, and to Si device manufacture by a process comprising such conversion.

BACKGROUND OF THE INVENTION

Recently, there has been increased interest in techniques for recrystallizing thin layers of semiconductor, especially silicon, on a buried noncrystalline insulator layer. This technology is generally referred to as silicon-on-insulator (SOI) technology.

SOI technology offers the promise of, inter alia, improved device isolation, reduced junction and parasitic capacitance, and of improved radiation hardness. The method of forming a monocrystalline layer of Si on a layer of $SiO_2$ that is of interest herein will be referred to as the melting/recrystallization (MR) method. See, for instance, H. W. Lam et al, in *VLSI Electronics: Microstructure Science*, Vol. 4, N. G. Einspruch, editor, Academic Press (1982), pp. 1-54.

In the MR method, typically a layer of $SiO_2$ is formed on a single crystal Si substrate, is optionally patterned, a layer of poly-Si is deposited thereover, the poly-Si layer is melted in whole or in part, and one or more solidification fronts are caused to advance laterally across the poly-Si layer. See, for instance, U.S. Pat. No. 4,323,417, issued Apr. 6, 1982, to H. W. Lam.

Various heat sources have been used in the MR method, including strip heaters, electron or laser beams, and tungsten halogen lamps or other sources of high-intensity noncoherent radiation. Various variants of the MR method are known to the art. Among the techniques is a global melting approach, typically comprising simultaneous exposure of a whole wafer to high intensity visible and infrared radiation (G. K. Celler et al, in *Laser-Solid Interactions and Transient Thermal Processing of Materials*, J. Narayan et al, editors, North Holland, N.Y. (1983), pp. 575-580). A different technique comprises zone melting, i.e., the relatively slow scan of a strip-like hot zone across the sample. The sample, e.g., a wafer, is typically coupled to a heat source that maintains the sample at a temperature several hundred °C. below the melting temperature of the semiconductor material, and the strip-like hot zone (in which the semiconductor material is molten) is scanned across the sample. A variety of means exists for producing the moving hot zone, e.g., a line-focused laser or other light source, or an electron beam. Graphite strip heaters are also used in the prior art. See, for instance, the Fan patent or M. W. Geis et al, *Journal of the Electrochemical Society: Solid State Science and Technology*, Vol. 129(12), pp. 2812-2818 (1982).

Typically, a capping layer is formed atop the deposited poly-Si to prevent agglomeration and evaporation of the molten Si. The capping layer typically comprises an oxide, e.g., $SiO_2$. See U.S. Pat. No. 4,371,421, issued Feb. 1, 1983, to J. C. C. Fan et al (Fan). It has been found, however, that the presence of a bare $SiO_2$ capping layer cannot reliably prevent balling of the molten portion of the poly-Si layer. Improvement has been achieved by coating the $SiO_2$ capping layer with a Si-rich $SiN_x$ film deposited by sputtering of a $Si_3N_4$ target, with nitrogen diffusing through the cap layer to the Si/$SiO_2$ interface where it promotes wetting. Although capable of producing recrystallized Si films of relatively high quality, wetting was found to be not reliable, with film agglomeration, void formation, and thickness variation occurring with unacceptably high frequency.

A capping technique which was said to have greater reproducibility was disclosed by C. K. Chen et al, *Applied Physics Letters*, Vol. 48(19), pp. 1300-1302 (1986). These workers reported that annealing of a Si/$SiO_2$/0.5 $\mu$m poly-Si/$SiO_2$ sandwich at 1100° C. for 3 hours in $NH_3$, oxidizing for about 20 minutes in $O_2$, and annealing in $NH_3$ for an additional 3 hours results in a cap that is wetted well by the molten poly-Si. The reference reports also that the above treatment results in the presence of a small amount of nitrogen (N) at the poly-Si/cap $SiO_2$ interface, and that the interfacial N promotes wetting of the molten Si during MR. For thicker (1 $\mu$m) poly-Si films a single 8 hours $NH_3$ anneal was reported to be also effective.

Despite the fact that incorporation of N by the above prior art annealing method improves the reliability of wetting, it has been found that thus produced recrystallized thin Si layers frequently still contain imperfections that limit their usefulness as device material. In particular, recrystallized Si layers have been found to frequently have substantial surface roughness, especially if the melt parameters are not closely controlled. A Si layer comprising such rough surface areas frequently would not be acceptable as device material. Furthermore, as is apparent from the above discussion, prior art techniques for introducing interfacial N require lengthy heat treatment at elevated temperature, and may result in the introduction of N, a donor element, into the recrystallized Si, thereby changing the conduction characteristics of the Si.

In view of the potential significance of SOI devices, availability of a reliable MR method that can result in formation of device quality Si on $SiO_2$ and that is not subject to some or all of the above discussed shortcomings of the prior art would be desirable. This application discloses such a method.

GLOSSARY AND DEFINITIONS

By a "single crystal" Si film or "monocrystalline" Si film, we mean herein a thin layer of crystalline Si that has essentially the same crystalline orientation throughout the layer. In agreement with current usage, a Si film is still considered to be a single crystal or monocrystalline Si film even though it may contain defects such as dislocations, and even though the defects may form two-dimensional arrays such as small angle grain boundaries, as long as essentially no portion of the volume of the Si film is enclosed by such boundaries.

By a "poly-Si" layer we mean an amorphous or polycrystalline Si layer.

SUMMARY OF THE INVENTION

Figure 1:
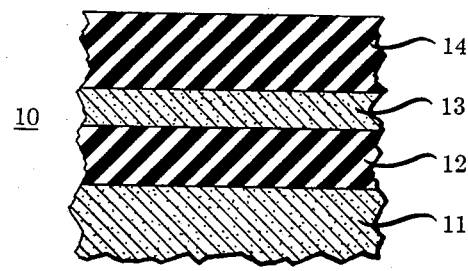
FIG. 1 schematically depicts a cross sectional view of a $SiO_2$/Si/$SiO_2$ sandwich on a Si substrate.

It is an objective of this invention to provide a MR method for producing a SOI structure that use an effective wetting agent which, if it becomes incorporated into the recrystallized Si film of the SOI structure, does not have any substantial effect on the electrical conduction properties of the Si film.

It is another objective of the invention to provide convenient, reliable, and effective methods for introducing a wetting agent into the $SiO_2/Si/SiO_2$ sandwich that do not require the long heat treatment associated with the preferred prior art method of introducing nitrogen.

And it is a further objective to provide an improvement in the strip heater MR technique that results in substantially improved quality of the monocrystalline Si layer produced thereby. In particular, the improvement can result in Si film having Rutherford backscattering $\chi min < 5\%$, with the only significant defect typically being widely spaced small angle tilt boundaries (typically misalignment of 0.2° or less) formed by threading dislocations.

These (and other) objectives are attained, respectively, by use of carbon (C) as a wetting agent, by introducing the setting agent (N or C) by exposing the Si film (prior to completion of cap formation) to a gas that comprises a wetting agent-containing molecular species, and by choice of conditions such that the thermal gradient across the solidification front is substantially smaller than used by the prior art.

Carbon has been found to be an effective wetting agent that, in the amounts incorporated into the Si film, does not have any significant effect on the electronic properties of the recrystallized Si. Carbon can be introduced into the $SiO_2/Si/SiO_2$ sandwich by any appropriate method, including ion implantation, and at any appropriate time prior to melting of the Si film. Although the invention is not necessarily so limited, it is currently believed that in order to be effective, a certain amount (currently believed to be about 0.1-3 monolayers) of C has to be present at least at one of the two $SiO_2/Si$ interfaces. The currently preferred methods for introducing C are the inventive methods that will be discussed next.

In one (and currently preferred) embodiment, the inventive technique for causing an effective amount of the wetting agent to be present in the $SiO_2/Si/SiO_2$ sandwich comprises "soaking" (prior to cap formation) the wafer in an atmosphere comprising a wetting agent-containing molecular species. Exemplarily, the soak is carried out after deposition of the poly-Si layer, the atmosphere comprises a hydrocarbon such as methane ($CH_4$), $C_2H_2$, $C_2H_6$, or ammonia ($NH_3$), the wafer is maintained at a temperature effective in causing a pyrolytic reaction of the wetting agentcontaining species (e.g., 500°-900° C.) for a period of time sufficient to result in deposition of an effective amount of C or N, respectively, on the Si film. Typically, the effective time will be within the range from 1-30 minutes. Prior to exposure of the poly-Si surface to the wetting agent-containing atmosphere the surface is typically cleaned by a known technique. After exposure, the cap layer is advantageously formed in situ, without exposure of the sample to air. The $SiO_2$ cap layer can be formed by any appropriate deposition technique. We have found growth by chemical vapor deposition (CVD), using known precursors such as tetraethylorthosilicate (TEOS) or silane, to be advantageous.

Although currently not preferred, it is possible to soak the wafer in the wetting agent-containing atmosphere prior to the deposition of the poly-Si layer on the (first) $SiO_2$ layer.

In another embodiment the inventive technique comprises incorporation of the wetting agent into the cap layer during cap formation. This is advantageously accomplished by formation of the cap material by CVD, with the atmosphere comprising, in addition to an appropriate precursor such as TEOS or $SiH_4 + O_2$, an effective amount of a wetting agent-containing molecular species such as $CH_4$, $C_2H_2$, $C_2H_6$, or $NH_3$. Exemplarily, the flow ratio of Si-containing precursor gas to wetting agent-containing precursor is within the range 100:1-5:1, and the sample is maintained at a temperature in the range 500°-900° C. The above capforming procedure results in the formation of $SiO_2$ cap that contains a minor amount of wetting agent (not necessarily uniformly distributed). During the heating that attends the melting of the Si film, diffusion of the wetting agent can take place, which can result in the presence of an effective amount of wetting agent at the Si/cap interface. Although not currently preferred, the wetting agent can be incorporated into the first $SiO_2$ layer.

As is apparent from the above description of two embodiments, the inventive method does not require a separate heat treatment of the wetting agent-containing sandwich prior to the melting of the Si film. The attendant simplification of processing, and shortening of processing time, are of economic significance and constitute an advantage of the inventive technique. A further significant advantage is the reproducibly high quality of the resulting monocrystalline Si film, including the substantially uniformly smooth surface of films produced by the inventive method, that can be attained under a broader range of MR processing conditions.

Although the wetting-related aspects of the invention are primarily discussed wherein in reference to MR techniques in which a melt zone is scanned across a capped Si layer, the invention is not so limited. In particular, C can be used as a wetting agent also in the global melting technique (see G. K. Celler et al, op. cit.), and the above described inventive techniques for incorporating the wetting agent into the $SiO_2/Si/SiO_2$ sandwich can also be used inconjuction with the global melting technique.

We have also discovered the existence of a previously unknown parameter regime in the MR technique that can result in monocrystalline Si films of substantial improved crystalline quality, as compared to prior art Si layers. In particular, we have found that Si films that solidified under very low thermal gradient conditions (the gradient typically being less than about 4° C./mm across the solidification front, normal to the front in the layer plane) have a qualitatively and quantitatively different defect structure than have films grown under the moderate to high thermal gradient conditions (gradient substantially greater than 4° C./mm) typically employed in the prior art.

In at least some circumstances, it may also be found desirable to reduce the speed at which the solidification front is scanned across the film to a value substantially lower than customary in the prior art. For instance, we have advantageously used scan speeds in the range 50-300 μm/sec. This can be compared to typical prior art speeds $\geq 0.5$ mm/sec. Furthermore, we have found that use of a higher base temperature (the temperature at which the wafer is maintained by the lower heater without any heating by the strip heater) than commonly used in the prior art can reduce the incidence of slip in the Si substrate. We have thus found the use of a base temperature that is 25°–100° C. lower than the melting temperature of Si to be advantageous.

Si films produced by the prior art (high gradient) MR technique typically show a network of branched tilt boundaries, with misalignment across boundaries typically in the order of 1°–3°, the tilt boundaries containing edge dislocations that typically run approximately in the plane of the film. On the other hand, monocrystalline Si films produced by the inventive (low gradient) MR technique contain essentially only unbranched subboundaries that contain mostly "threading" dislocations (i.e., dislocations that run approximately normal to the plane of the film and thus have less detrimental effect in device manufacture than in-plane dislocations), with the misalignment across a subboundary typically being about an order of magnitude smaller than in the prior art films. Typical misalignments in Si layers according to the invention are about 0.1°–0.2°. Monocrystalline films grown by the inventive technique furthermore have wider spacing (e.g., about 50 μm) between subboundaries than prior art material (which typically has spacings of about 5–20 μm), and can have a Rutherford backscattering yield $\chi_{min}$ (a common measure of crystalline quality) essentially in distinguishable from bulk single crystal Si (3%). This is to be compared with typical prior art $\chi_{min}$ of 50–80% for unseeded material.

Essentially all prior art IC technologies, including C-MOS, can be implemented in SOI wafers produced by the inventive method. In some of these ICs all of the devices may be formed in the Si layer formed according to the invention, whereas others may be of a hybrid type, with some of the devices formed in the substrate Si. Among devices that can advantageously be implemented (in SOI as well as in the referred to hybrid technique) on inventive wafers are devices of the type disclosed in U.S. Pat. No. 4,453,306, co-assigned with this.

The previously discussed aspects of the invention are currently believed to be most advantageously used in the MR growth of thin (typically less than about 2–3 μm) monocrystalline Si layers on $SiO_2$. However, a thin layer grown according to the invention can serve as the substrate in the epitaxial growth, by a known technique, of a "thick" (typically about 3–30 μm) monocrystalline Si film.

Our past attempts at growing epitaxial thick Si films by using thin prior art monocrystalline Si films as substrate resulted in thick films that comprised an unacceptably large portion of highly defective material. However, these problems are absent when "low gradient" thin films according to the invention are used as seed layer for the epitaxial growth, by any appropriate method, of thick monocrystalline Si films. Not only can the thus grown thick film consist essentially exclusively of epitaxial material of quality comparable to that of the thin Si seed film, but at least in some cases we have found that the subboundaries that were present in the seed film did not propagate to the surface of the thick film grown thereon. The inventive technique thus can conveniently and inexpensively result in the formation of device quality thick Si films on relatively thick (e.g., 1–5 μm) high dielectric strength $SiO_2$ layers. In such material, high voltage semiconductor devices such as transistors (discrete or integrated) can be fabricated by known techniques. A particular and significant application of such high voltage integrated electronic devices is considered to be a voltage step-up circuit that permits elimination of the ballast transformer in fluorescent lighting means. A circuit that achieves this function using several discrete transistors is known, and lighting means comprising the discrete circuit are believed to be commercially available from North American Philips. However, these prior art means are quite costly and cumbersome, and replacement of the discrete devices by a high-voltage SOI integrated circuit would result in lower cost and increased convenience. For instance, it would permit substitution of fluorescent light bulbs for incandescent ones, without change of fixture. The economic significance of such replacement probably requires no discussion.

DETAILED DESCRIPTION OF SOME PREFERRED EMBODIMENTS

FIG. 1 shows a cross sectional segment of an exemplary capped SOI wafer 10, in which 11 is a standard single crystal Si wafer, 12 is a (about 1 μm) $SiO_2$ layer, 13 is a thin (about 0.5 μm) Si layer, and 14 is (about 2 μm) $SiO_2$ cap layer. The quoted thicknesses are exemplary only. Prior to melting and recrystallization, 13 is polycrystalline or amorphous (collectively referred to as poly-Si), whereas after recrystallization, it is monocrystalline, typically of (100) orientation.

Figure 2:
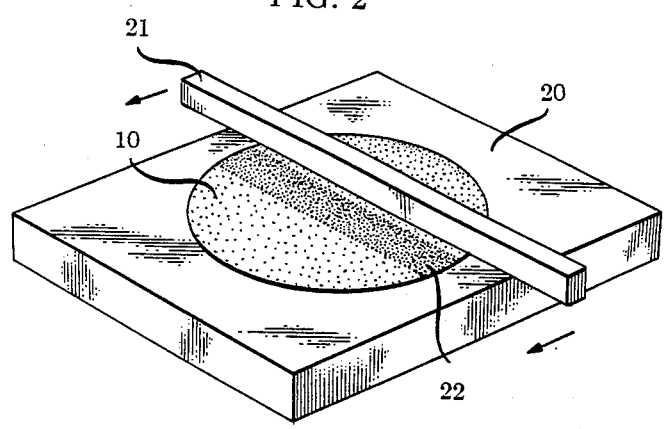
FIG. 2 shows schematically one type of apparatus for the practice fo the MR technique.

FIG. 2 is a schematic representation of a known MR technique, namely, the strip heater zone melting technique. Numeral 20 refers to the lower heater, 21 is a strip heater (e.g., a 1 $mm^2$ graphite strip maintained about 1 mm above the top surface of wafer 10), and 22 indicates the portion of the wafer in which Si layer 13 is molten. The molten zone is scanned across the wafer by moving the strip heater, as indicated by the two arrows. The lower heater is set such that the wafer base temperature is about 300°–25° C. below the melting temperature of Si, and the strip heater typically is set to about 2000°–2500° C. Prior art scanning speeds typically are 0.5 mm/sec and above, whereas we have found that substantially slower speeds frequently are advantageous. The MR technique can be practiced in air (except when using a graphite or other oxidizable heater), in vacuum or in an inert atmosphere.

EXAMPLE 1

The (100) surface of a standard 100 mm Si wafer was cleaned by a known procedure and a 2 μm thick unpatterned layer of thermal $SiO_2$ formed thereon by heating at 1100° C. in pyrogenic steam. After completion of $SiO_2$ growth the wafer was transferred to a low pressure CVD (LPCVD) apparatus, in which a 1 μm thick continuous amorphous Si layer was grown on the $SiO_2$ layer by pyrolysis of silane at 570° C. The thus produced $Si/SiO_2/Si$ wafer was then transferred to a second LPCVD apparatus in which the wafer was heated to 730° C. in flowing argon (Ar), the pressure reduced to about 0.1 Torr while the Ar flow continued. The Ar flow was then terminated and $CH_4$ flowed (0.1 Torr pressure) through the chamber. The sample was soaked in the $CH_4$ for 10 minutes, then the $CH_4$ flow was terminated, and TEOS gas introduced. A 2 μm thick layer of $SiO_2$ was formed atop the methane-treated Si by a known LPCVD process. After removal of the wafer from the LPCVD apparatus, it was introduced into a graphite strip heater MR apparatus. The apparatus was evacuated to $10^{-6}$ Torr, the wafer temperature raised by means of the lower heater to a base temperature of 1200° C., the apparatus backfilled with 250 Torr of Ar, and then the graphite strip (4×0.25 mm cross section) was resistively heated to about 2000° C., (the temperature adjusted such that the width of the molten strip is about 0.5 mm). The strip heater was about 2 mm above the wafer surface, and was scanned at 200 μm/sec across the wafer in a direction aligned with a <010> crystal direction.

After cooling of the wafer to room temperature, the cap oxide was removed by etching in concentrated liquid HF and the recrystallized Si examined by means of Rutherford backscattering and electron microscopy. The measured χmin was 3%, the orientation was (100) throughout, with subboundary spacing of 40–80 μm, with cumulative orientation misalignment not exceeding 0.2° over the examined area (several cm²).

EXAMPLE 2

A SOI sample was prepared substantially as described in Example 1, except that, after completion of the cap layer, a 5 μm wide circular line, located 2 mm from the edge of the wafer, is defined lithographically and etched by reactive ion etching through the cap, the underlying poly-Si, and the buried oxide, to the substrate. This line provided crystallographic seeding (connecting the molten Si film to the (100) Si substrate by capillary action) for the MR process. The recrystallized Si film was of the same crystallographic orientation as the Si substrate except for subboundary misalignments of less than 0.2°.

EXAMPLE 3

A SOI wafer is produced substantially as described in Example 1, except that the poly-Si is soaked in $NH_3$ instead of in $CH_4$.

EXAMPLE 4

A SOI wafer was produced substantially as described in Example 3, except that the sample was not soaked, and that the cap layer was produced by pyrolysis of a $TEOS-NH_3$ atmosphere (flow ratio 20:1).

EXAMPLE 5

A SOI wafer was produced substantially as described in Example 1, except that after removal of the cap layer, the wafer was cleaned in a CVD apparatus (30 sec at 1200° C. in flowing $H_2+HCl$, 95 l/min:0.9 l/min), and 20 μm of epitaxial Si was grown in situ on the Si layer (4 minutes at 1150° C. in $H_2+SiHCl_3$, flow rate 100 l/min of $H_2+18$ gm/min of $SiHCl_3$). The resulting thick film of single crystal Si had a uniform, smooth surface, χmin of 3%, and the cumulative misorientation did not exceed 0.2°.

EXAMPLE 6

A SOI wafer was produced substantially as described in Example 1, except that the scan velocity was 1 mm/sec, the strip heater temperature was about 2250° C., and the melt width was about 3 mm. The recrystallized Si film showed branched tilt boundaries (average spacing about 10 μm), with cumulative misorientation of about 3°.

EXAMPLE 7

An approximately 20 μm thick layer of Si was produced substantially as described in Example 5, except that the seed Si layer was produced substantially as described in Example 6. The thick Si film had a rough surface due to presence of a substantial amount of highly defective material in wedge-shaped sections originating at the subboundaries of the seed material.

EXAMPLE 8

A SOI wafer was produced substantially as described in Example 1. The resulting 0.5 μm thick Si layer was doped p⁻ by implantation of boron, and n-channel FET devices produced in the doped Si layer by a standard known technique. The thus produced devices functioned in the expected fashion and had electron mobilities essentially identical to those observed in control devices, having the same doping levels and geometry, fabricated in bulk Si.

What is claimed is:

1. A method of manufacturing an electronic device comprising
   providing a single crystal Si substrate having a major surface and forming a multilayer structure thereon by a process comprising
   (a) forming a first $SiO_2$ layer on the major surface of the Si substrate;
   (b) forming a Si layer on the first $SiO_2$ layer;
   (c) forming a $SiO_2$ cap layer on the Si layer;
   (d) melting at least a portion of the Si layer, and permitting resolidification of the melted portion of the Si layer, the resolidified layer being substantially monocrystalline; and the method further comprises
   completing manufacturing the electronic device;
   characterized in that the method further comprises
   causing an amount of carbon, effective to insure wetting of at least one of the first $SiO_2$ layer and the $SiO_2$ cap layer by the molten Si, to be present in the multilayer structure.

2. A method of manufacturing an electronic device comprising
   providing a single crystal Si substrate having a major surface and forming a multi-layer structure thereon by a process comprising
   (a) forming a first $SiO_2$ layer on the major surface of the Si substrate;
   (b) forming a Si layer on the first $SiO_2$ layer;
   (c) forming a $SiO_2$ cap layer on the Si layer;
   (d) melting at least a portion of the Si layer, and permitting resolidification of the melted layer, the resolidified Si layer being substantially monocrystalline; and the method further comprises
   completing manufacturing the electronic device;
   characterized in that the method further comprises
   introducing an amount of wetting agent that is effective to insure wetting of at least one of the first $SiO_2$ layer and the $SiO_2$ cap layer by the molten Si into the multilayer structure by a procedure that comprises contacting, prior to the completion of step (c), the multilayer structure with an atmosphere that comprises a wetting agent-containing molecular species while the multilayer structure is at a temperature that causes pyrolysis of the wetting agent-containing molecular species.

3. The method of claim 2, wherein the wetting agent-containing molecular species is chosen from the group consisting of $CH_4$, $C_2H_2$, $C_2H_4$, $C_2H_6$, and $NH_3$.

4. The method of claim 2, wherein the surface of the Si layer is contacted with the atmosphere that comprises the wetting agent-containing molecular species.

5. The method of claim 2, wherein the atmosphere is caused to contact the multi-layer structure during formation of the $SiO_2$ cap layer, with the atmosphere further comprising a Si-containing molecular species.

6. A method of manufacturing an electronic device comprising providing a single crystal substrate having a major surface and forming a multilayer structure thereon by a process comprising
  (a) forming a first SiO$_2$ layer on the major surface of the SiO$_2$ substrate;
  (b) forming a Si layer on the first SiO$_2$ layer;
  (c) forming a SiO$_2$ cap layer on the Si layer;
  (d) melting a portion of the Si layer, causing the melted portion to move across at least a part of the Si film, and permitting resolidification of the melted portion of the layer, the resolidified Si layer being substantially monocrystalline, associated with the melted portion being a resolidification front and a thermal gradient across the resolidification front, and the method further comprises completing manufacturing the electronic device;
  characterized inm that the thermal gradient across the resolidification front, normal to the resolidification front and in the plane of the Si film, is caused to be at most about 4° C./mm.

7. The method of claim 6, wherein step (d) comprises providing first means for uniformly heating the Si substrate, heating the Si substrate with the first means to a base temperature in the range from about 100° C.–25° C. below the melting temperature of Si, and providing second means for non-uniformly heating the Si substrate and the multilayer structure thereon such that the melted portion of the Si layer is strip-like.

8. The method of claim 6, comprising introducing an amount of wetting agent that is effective to insure wetting of at least one of the first SiO$_2$ layer and the SiO$_2$ cap layer by the molten Si into the multilayer structure by a procedure that comprises contacting, prior to the completion of step (c), the multilayer structure with an atmosphere that comprises a wetting agent-containing molecular species while the multilayer structure is at a temperature that causes pyrolysis of the wetting agent-containing molecular species.

9. Method of claim 6, comprising providing seeding means for contacting the single crystal Si substrate material with the molten Si such that the crystal orientation of the resolidified Si layer is determined by the crystal orientation of the Si substrate.

10. Method of claim 6, further comprising removing the SiO$_2$ cap layer from at least part of the resolidified Si layer, and depositing Si onto the resolidified Si layer such that the deposited Si is epitaxial with the resolidified Si layer, forming a "thick" Si layer, with the semiconductor device being formed in the thick Si layer.

* * * * *